United States Patent
Tanaka et al.

(10) Patent No.: US 10,692,766 B2
(45) Date of Patent: Jun. 23, 2020

(54) METHOD OF CUTTING WORKPIECE

(71) Applicant: DISCO CORPORATION, Tokyo (JP)

(72) Inventors: Makoto Tanaka, Tokyo (JP); Takatoshi Kyo, Tokyo (JP); Chan Kit Chee, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/008,310

(22) Filed: Jun. 14, 2018

(65) Prior Publication Data
US 2018/0366371 A1    Dec. 20, 2018

(30) Foreign Application Priority Data

Jun. 15, 2017 (JP) .................. 2017-117537

(51) Int. Cl.
| | |
|---|---|
| H01L 21/78 | (2006.01) |
| H01L 21/67 | (2006.01) |
| H01L 21/304 | (2006.01) |
| H01L 21/683 | (2006.01) |

(52) U.S. Cl.
CPC .......... *H01L 21/78* (2013.01); *H01L 21/3043* (2013.01); *H01L 21/67092* (2013.01); *H01L 21/6836* (2013.01); *H01L 2221/68327* (2013.01)

(58) Field of Classification Search
CPC ..... B26D 1/04; B28D 5/022; H01L 21/67092; H01L 21/78; Y10T 83/0524
See application file for complete search history.

(56) References Cited

U.S. PATENT DOCUMENTS

2014/0298968 A1* 10/2014 Hirosawa ............... H01L 21/78
                                                                83/39

FOREIGN PATENT DOCUMENTS

| JP | 2014204015 A | 10/2014 |
| JP | 2015076561 A | 4/2015 |
| JP | 2017168763 A * | 9/2017 |

* cited by examiner

*Primary Examiner* — Edward Chin
(74) *Attorney, Agent, or Firm* — Greer Burns & Crain, Ltd.

(57) ABSTRACT

A method of cutting a workpiece includes forming a guide groove to a depth smaller than the predetermined depth in the workpiece, the guide groove extending from the outer peripheral edge to an end portion of the device area, by causing a cutting blade to cut into the workpiece held on the holding surface of the chuck table from an outer peripheral edge of the workpiece along one of the projected dicing lines; and forming a groove to the predetermined depth in the workpiece along the projected dicing line, the groove extending from the device area beyond an opposite end of the device area to a portion of the outer peripheral extra area, after lowering the cutting blade toward and into the guide groove in the device area and then positioning a cutting edge thereof at the predetermined depth.

2 Claims, 5 Drawing Sheets

METHOD OF CUTTING WORKPIECE

BACKGROUND OF THE INVENTION

Field of the Invention

The present invention relates to a method of cutting a workpiece such as a semiconductor wafer, a bonded wafer, a packaged wafer, or the like.

Description of the Related Art

There have been known cutting apparatus for cutting various plate-shaped workpieces including semiconductor wafers with various devices formed thereon, optical device wafers with optical devices such as light emitting diodes (LEDs) or the like formed thereon, packaged substrates with a plurality of device chips molded by a resin, and so on, into individual device chips with a cutting blade.

Such a workpiece has on a face side thereof a device area with a plurality of devices formed therein and an outer peripheral extra area surrounding the device area. When the device area is divided by a cutting blade, the outer peripheral extra area that is also divided and offcut chips are scattered. This is liable to damage the cutting blade. There has been proposed a processing method in which the processing of a workpiece comes to an end while the areas of offcut chips are kept large in order not to scatter the offcut chips, as disclosed in Japanese Patent Laid-Open No. 2014-204015 or Japanese Patent Laid-Open No. 2015-076561.

SUMMARY OF THE INVENTION

Bonded wafers are made up of two wafers bonded to each other. If the bonding of an outer periphery of such a bonded wafer is not strong enough, then when the outer periphery is divided into chips, offcut chips are easily scattered. To alleviate this drawback, there may be carried out a processing method that selectively dices only the device area of a workpiece with a cutting blade. According to such a processing method, the cutting blade cuts into a workpiece in a chopper cutting mode. However, since the chopper cutting mode has a higher processing rate than a traverse cutting mode in which the cutting blade processes the workpiece horizontally, the workpiece surface tends to produce large chippings.

It is therefore an object of the present invention to provide a method of cutting a workpiece while restraining the production of surface chippings in a chopper cutting mode and at the same time preventing offcut chips from being formed on an outer peripheral extra area of the workpiece.

In accordance with an aspect of the present invention, there is provided a method of cutting a plate-shaped workpiece having on a face side thereof a device area that is demarcated by a grid of projected dicing lines into a plurality of subareas where respective devices are formed, and an outer peripheral extra area surrounding the device area, to form cut grooves having a predetermined depth in the device area of the workpiece. The method includes: a holding step of holding the workpiece on a holding surface of a chuck table; a guide groove forming step of forming a guide groove to a depth smaller than a predetermined depth in the workpiece, the guide groove extending from an outer peripheral edge to an end portion of the device area by causing a cutting blade to cut into the workpiece held on the holding surface of the chuck table from an outer peripheral edge of the workpiece along one of the projected dicing lines; after the guide groove forming step, a first retracting step of retracting the cutting blade away from the workpiece by lifting the cutting blade; after the first retracting step, a device area processing step of forming a groove to the predetermined depth in the workpiece along the projected dicing line, the groove extending from the device area beyond an opposite end of the device area to a portion of the outer peripheral extra area, after lowering the cutting blade toward and into the guide groove in the device area and then positioning a cutting edge thereof at the predetermined depth; and after the device area processing step, a second retracting step of retracting the cutting blade away from the workpiece by lifting the cutting blade while leaving a portion of the outer peripheral extra area uncut, in which surface chippings are prevented by the guide groove from being produced on the workpiece when the cutting blade is lowered toward and into the guide groove at the device area processing step.

Preferably, the method further includes, before the holding step, a sticking step of sticking a dicing tape to a reverse side of the workpiece, in which the workpiece is held on the holding surface of the chuck table through the dicing tape, and the cutting edge of the cutting blade is caused to cut into the workpiece as far as the dicing tape to form the groove to the predetermined depth, thereby fully severing the workpiece.

In the method according to the present invention, since the cutting blade initially cuts the shallow guide groove in a traverse cutting mode in the outer peripheral extra area and a part of the device area contiguous to the outer peripheral extra area, which will be processed by the cutting blade in a chopper cutting mode, surface chippings are prevented from being produced particularly in the device area when the device area is processed by the cutting blade in the chopper cutting mode. Consequently, the outer peripheral extra area of the workpiece is prevented from producing offcut chips when the workpiece is cut by the cutting blade.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
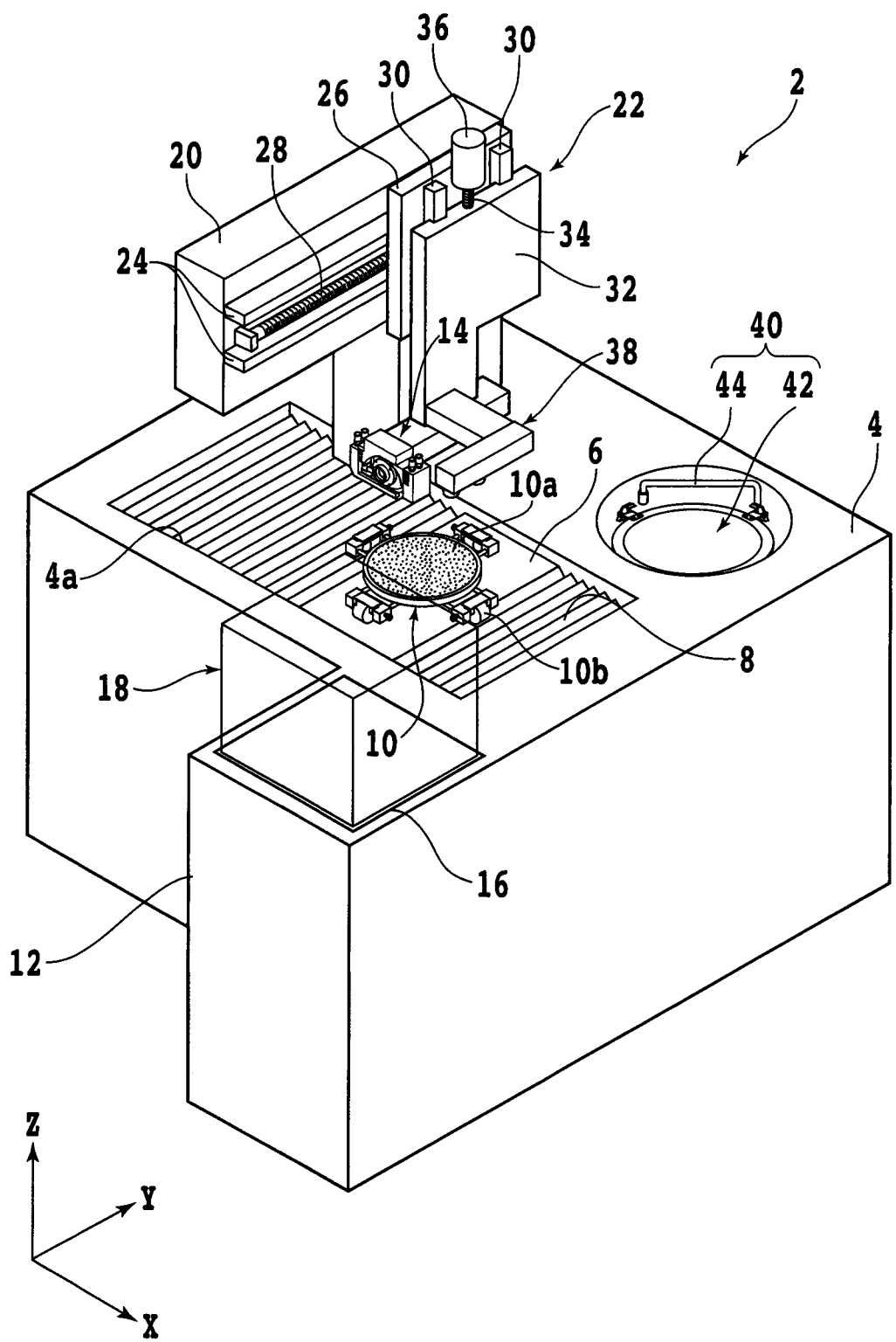
FIG. 1 is a perspective view of a cutting apparatus suitable for carrying out a method of cutting a workpiece according to the present invention.

Preferred embodiments of the present invention will be described in detail below with reference to the drawings. FIG. 1 depicts in perspective a cutting apparatus 2 suitable for carrying out a method of cutting a workpiece according to the present invention. As depicted in FIG. 1, the cutting apparatus 2 includes a support base 4 with a rectangular opening 4a defined in an upper surface thereof, the rectangular opening 4a being elongate in X-axis directions (processing-feed directions). In the rectangular opening 4a, there are provided an X-axis movable table 6, an X-axis moving mechanism, not depicted, for moving the X-axis movable table 6 in the X-axis directions, and a dust-proof and drip-proof cover 8 that covers the X-axis moving mechanism. The X-axis moving mechanism includes a pair of X-axis guide rails, not depicted, extending parallel to the X-axis directions. The X-axis movable table 6 is slidably mounted on the X-axis guide rails.

The X-axis movable table 6 has on a lower surface thereof a nut, not depicted, threaded over an X-axis ball screw, not depicted, extending parallel to the X-axis guide rails. The X-axis ball screw has an end coupled to an X-axis stepping motor, not depicted. The nut, the X-axis ball screw, and the X-axis stepping motor serve as part of the X-axis moving mechanism. When the X-axis stepping motor is energized to rotate the X-axis ball screw about its own axis, the X-axis ball screw causes the nut to move the X-axis movable table 6 in one of the X-axis directions along the X-axis guide rails.

The X-axis movable table 6 supports thereon a chuck table 10 for holding a workpiece under suction thereon. The chuck table 10 is coupled to a rotary actuator, not depicted, such as an electric motor or the like for rotation about an axis extending substantially parallel to Z-axis directions (vertical directions) perpendicular to the X-axis directions. The chuck table 10 can also be processing-fed in the X-axis directions by the X-axis moving mechanism.

The chuck table 10 has an upper surface serving as a holding surface 10a for holding the workpiece under suction thereon. The holding surface 10a is made of a porous material, for example, and connected to a suction source, not depicted, through a channel, not depicted, defined in the chuck table 10. A plurality of clamps 10b for securing the workpiece in place on the chuck table 10 are provided surrounding the chuck table 10.

The workpiece includes, for example, a bonded wafer made up of two wafers bonded to each other. The workpiece is stuck to a dicing tape held on an annular frame, and will be handled together with the dicing tape and the annular frame. When the workpiece is handled together with the dicing tape and the annular frame, the workpiece is protected from impacts as the dicing tape and the annular frame act as workpiece guards.

A protrusive block 12 projects laterally from a front corner of the support base 4 that is spaced from the rectangular opening 4a. The protrusive block 12 has a space defined therein which houses a vertically movable cassette elevator 16. The cassette elevator 16 has an upper surface for placing thereon a cassette 18 that can store a plurality of workpieces therein.

A delivery unit or transfer unit, not depicted, for unloading a workpiece from the cassette 18 and delivering the unloaded workpiece to the chuck table 10 is disposed on the support base 4 at a position near the rectangular opening 4a. The workpiece that is unloaded from the cassette 18 by the delivery unit is placed on the holding surface 10a of the chuck table 10.

The cutting apparatus 2 further includes a support structure 20 for supporting a cutting unit 14 for cutting a workpiece. The support structure 20 is mounted on an upper surface of the support base 4 in overhanging relation to the rectangular opening 4a. The support structure 20 supports on a front upper surface thereof a cutting unit moving mechanism 22 for moving the cutting unit 14 in Y-axis directions (indexing-feed directions) perpendicular to the X-axis directions and the Z-axis directions) and also in the Z-axis directions.

The cutting unit moving mechanism 22 includes a pair of Y-axis guide rails 24 disposed on a front surface of the support structure 20 and extending parallel to the Y-axis directions. The cutting unit moving mechanism 22 also includes a Y-axis movable plate 26 slidably mounted on the Y-axis guide rails 24. The Y-axis movable plate 26 has on a reverse (rear) side thereof a nut, not depicted, threaded over a Y-axis ball screw 28 extending parallel to the Y-axis guide rails 24.

The Y-axis ball screw 28 has an end coupled to a Y-axis stepping motor, not depicted. The nut, the Y-axis ball screw 28, and the Y-axis stepping motor serve as part of the Y-axis moving mechanism 22. When the Y-axis stepping motor is energized to rotate the Y-axis ball screw 28 about its own axis, the Y-axis ball screw 28 causes the nut to move the Y-axis movable table 26 in one of the Y-axis directions along the Y-axis guide rails 24.

The Y-axis movable plate 26 supports on a face (front) side thereof a pair of Z-axis guide rails 30 extending parallel to the Z-axis directions. A Z-axis movable plate 32 is slidably mounted on the Z-axis guide rails 30.

The Z-axis movable plate 32 has on a reverse (rear) side thereof a nut, not depicted, threaded over a Z-axis ball screw 34 extending parallel to the Z-axis guide rails 30. The Z-axis ball screw 34 has an end coupled to a Z-axis stepping motor 36. When the Z-axis stepping motor 36 is energized to rotate the Z-axis ball screw 34 about its own axis, the Z-axis ball screw 34 causes the nut to move the Z-axis movable table 32 in one of the Z-axis directions along the Z-axis guide rails 30.

The cutting unit 14 for processing a workpiece and an image capturing unit 38 are fixedly mounted on a lower arm of the Z-axis movable plate 32. When the Y-axis movable plate 26 is moved in one of the Y-axis directions by the cutting unit moving mechanism 22, the cutting unit 14 and the image capturing unit 38 are indexing-fed in the Y-axis direction, and when the Z-axis movable plate 32 is moved in one of the Z-axis directions, the cutting unit 14 and the image capturing unit 38 are moved in the Z-axis direction, i.e., lifted or lowered.

The cutting apparatus 2 also includes a cleaning unit 40 disposed in a cylindrical cleaning space defined in the upper surface of the support base 4 at a position opposite the protrusive block 12 across the opening 4a. A workpiece that has been cut by the cutting unit 14 is delivered from the chuck table 10 to the cleaning unit 40 by a delivery mechanism, not depicted. The cleaning unit 40 includes a spinner table 42 for holding the workpiece under suction in the cylindrical cleaning space. The spinner table 42 has a lower end coupled to a rotary actuator, not depicted, such as an electric motor or the like that rotates the spinner table 42 about its own axis at a predetermined speed.

An ejector nozzle 44 for ejecting a cleaning fluid, typically a binary fluid that is a mixture of water and air, toward the workpiece is disposed over the spinner table 42. While the spinner table 42 that holds the workpiece is being rotated, the ejector nozzle 44 ejects the cleaning fluid to the workpiece to clean the workpiece that has been cut. The workpiece that has been cleaned by the cleaning unit 40 is delivered by a delivery mechanism, not depicted, back to the cassette 18, in which the workpiece is stored.

Figure 2A:
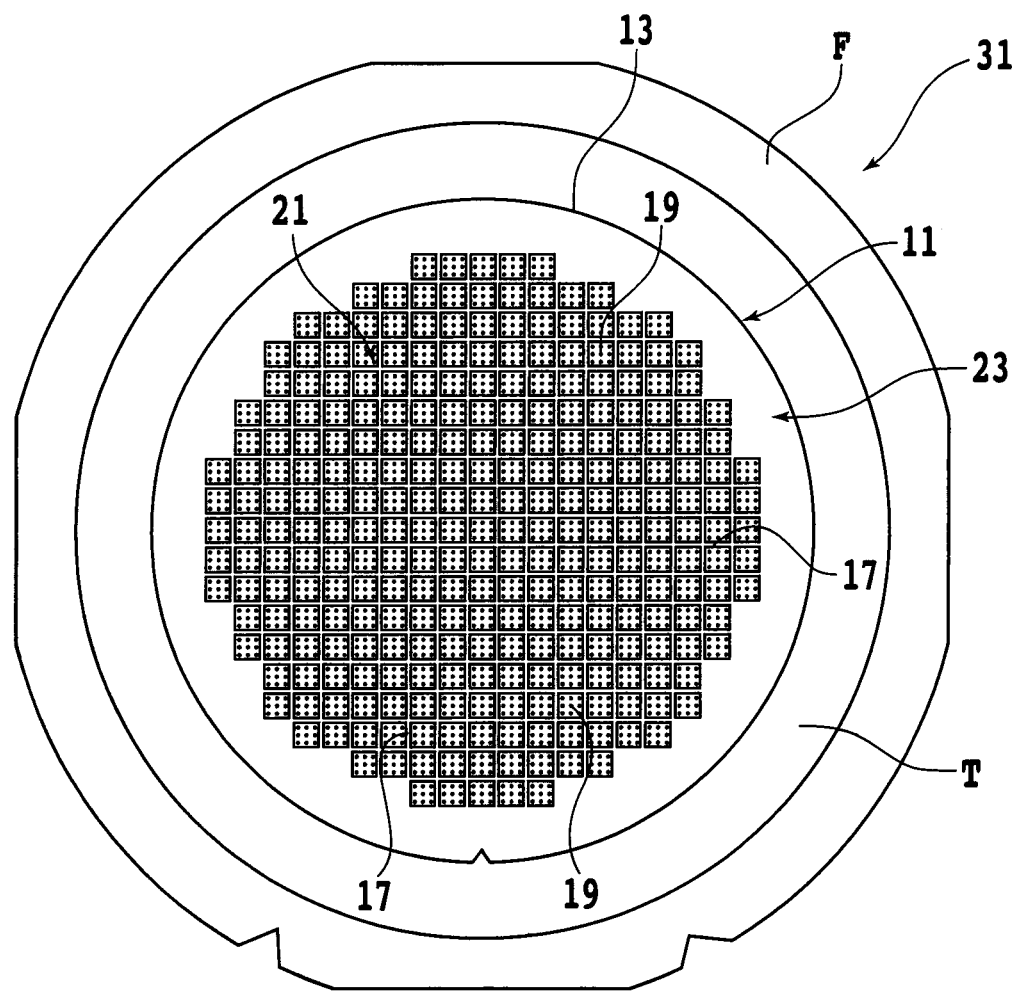
FIG. 2A is a plan view of a bonded wafer made up of two wafers bonded to each other, supported on an annular frame by a dicing tape.
Figure 2B:
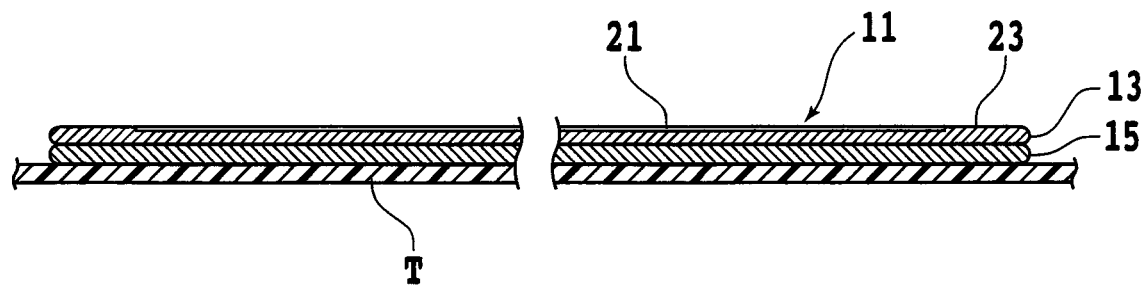
FIG. 2B is an enlarged fragmentary cross-sectional view of the wafer and the dicing tape depicted in FIG. 2A.

FIG. 2A depicts in plan a frame unit 31 in which a bonded wafer 11 as a workpiece to which the method according to the present invention is applicable is supported on an annular frame F through a dicing tape T. FIG. 2B depicts in cross section the bonded wafer 11 that is stuck to the dicing tape T.

The bonded wafer 11 is made up of a first wafer 13 and a second wafer 15 that are bonded to each other by an adhesive. The first wafer 13 has on a face side thereof a device area 21 that is demarcated by a grid of projected dicing lines 17 into a plurality of subareas where respective devices 19 are formed, and an outer peripheral extra area 23 surrounding the device area 21.

A method of cutting a workpiece according to a first embodiment of the present invention will be described below with reference to FIGS. 3A through 3C and FIGS. 4A and 4B.

In preparation for carrying out the method according to the first embodiment, the frame unit 31 is prepared by bonding the reverse side of the second wafer 15 of the bonded wafer 11 to the dicing tape T whose outer peripheral edge is mounted on the annular frame F, thereby supporting the bonded wafer 11 on the annular frame F through the dicing tape T.

After the frame unit 31 is prepared, the method of cutting the bonded wafer 11 is carried out as follows: The frame unit 31 is delivered to the chuck table 10, and held under suction on the holding surface 10b of the chuck table 10 with the dicing tape T interposed therebetween (holding step).

Figure 3A:
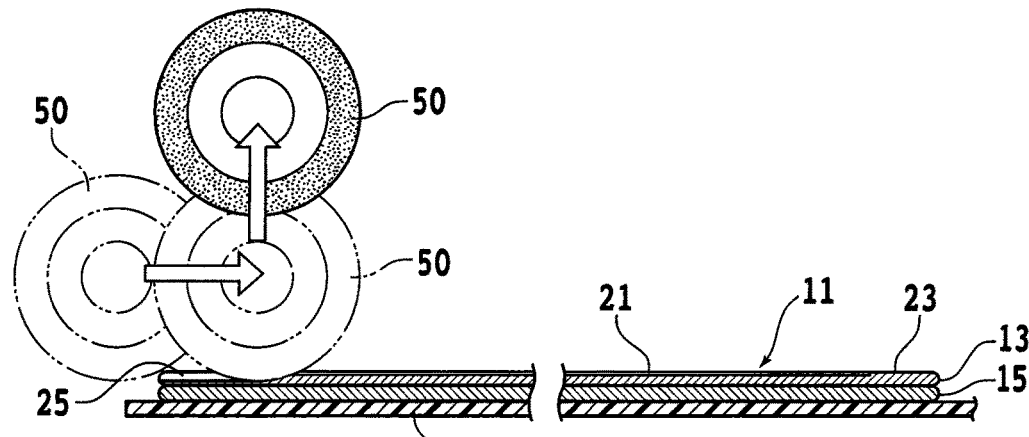
FIG. 3A is an enlarged fragmentary sectional side elevational view illustrating a guide groove forming step and a first retracting step.
Figure 3B:
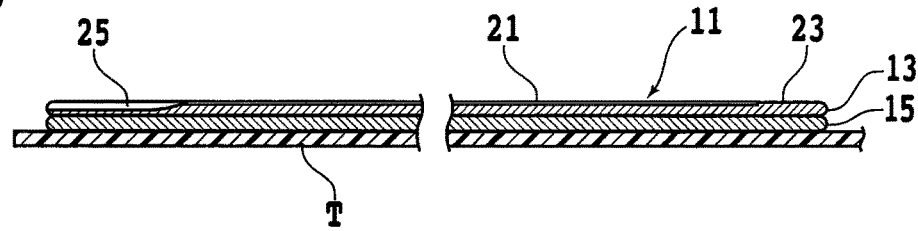
FIG. 3B is an enlarged fragmentary cross-sectional view of the bonded wafer with guide grooves defined therein.
Figure 3C:
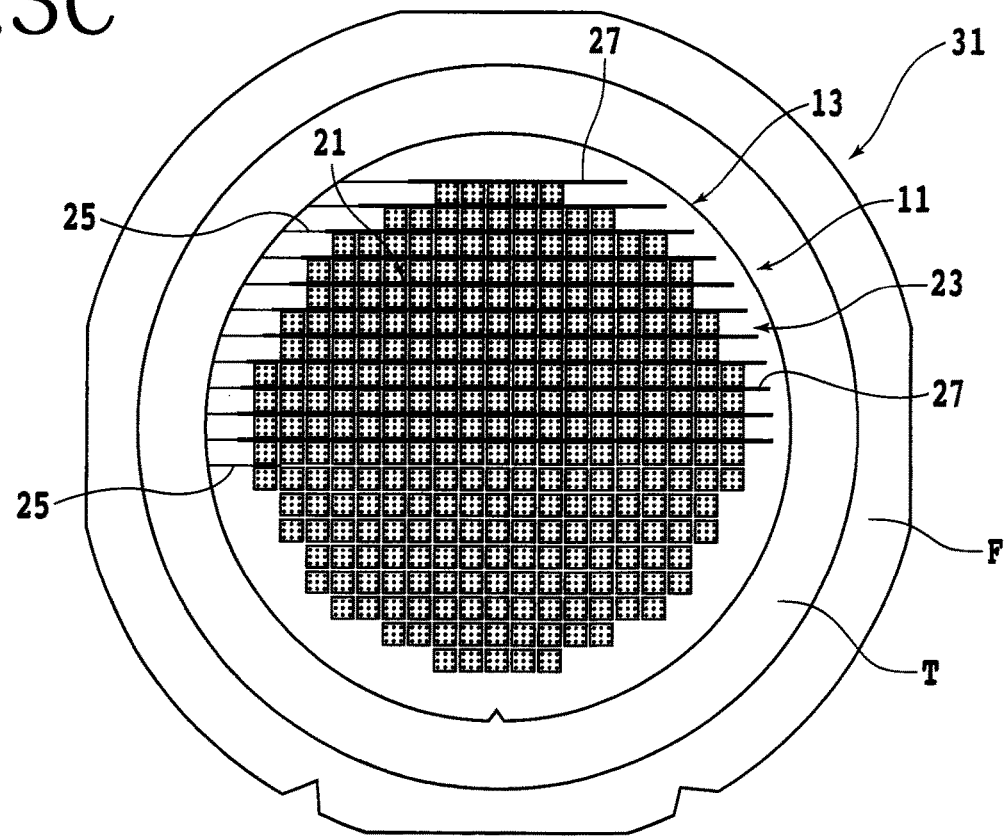
FIG. 3C is a plan view of the bonded wafer with cut grooves formed therein to a desired depth along some projected dicing lines, following the formation of the guide grooves.

After the holding step is performed, as depicted in FIG. 3A, the cutting unit 14 has its cutting blade 50 cut into the bonded wafer 11 held on the chuck table 10 from an outer peripheral edge thereof along one of the projected dicing lines 17, thereby forming a guide groove 25 having a first depth in the bonded wafer 11, the guide grooves 25 extending from the outer peripheral edge of the bonded wafer 11 to an end portion of the device area 21, as shown in FIGS. 3B and 3C (guide groove forming step). Then, the cutting blade 50 is lifted and retracted away from the bonded wafer 11 (first retracting step).

Figure 4A:
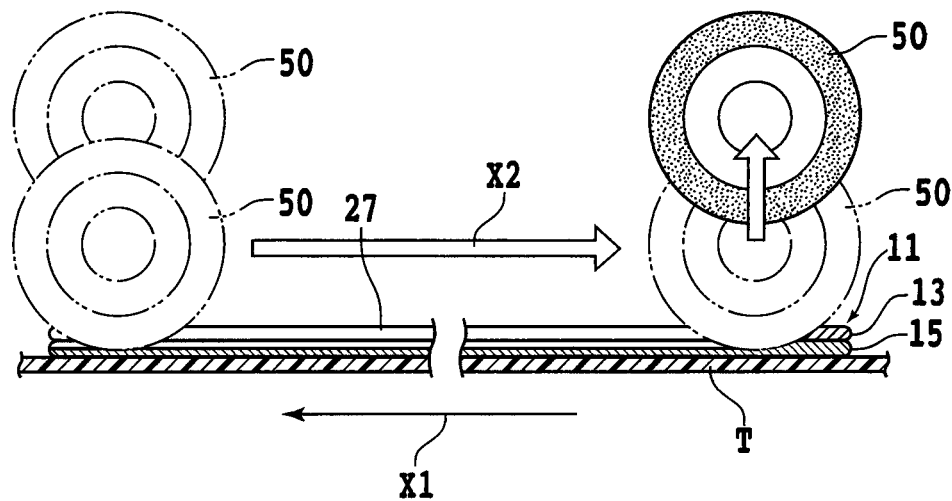
FIG. 4A is an enlarged fragmentary sectional side elevational view illustrating a device area processing step.

After the first retracting step is performed, the cutting blade 50 is lowered from the retracted position toward and into the guide groove 25 in the device area 21 and has its lowest cutting edge positioned at a second depth larger than the first depth, as depicted in FIG. 4A. Thereafter, the chuck table 10 with the bonded wafer 11 held thereon is processing-fed in the direction indicated by the arrow X1, thereby forming a cut groove 27 having the second depth in the bonded wafer 11 along at least the projected dicing line 17, the cut groove 27 extending from the device area 21 beyond an opposite end of the device area 21 to a portion of the outer circumferential extra area 23 (device area processing step).

In FIG. 4A, the direction indicated by the arrow X2 represents a direction along which the cutting blade 50 cuts the cut groove in the bonded wafer 11 in the device area processing step.

After the device area processing step is carried out, while leaving uncut a portion of the outer peripheral extra area 23 adjoining the end of the device area 21, the cutting blade 50 is lifted and retracted away from the bonded wafer 11, as depicted in FIG. 4A (second retracting step).

Consequently, the guide groove forming step, the first retracting step, the device area processing step, and the second retracting step are carried out successively along the same projected dicing line 17. Then, the cutting unit 14 is indexing-fed over the interval between adjacent projected dicing lines 17 in one of the Y-axis directions by the cutting unit moving mechanism 22, and aligned with a next projected dicing line 17 on the bonded wafer 11. Thereafter, the guide groove forming step, the first retracting step, the device area processing step, and the second retracting step are carried out successively along the next projected dicing line 17.

Figure 4B:
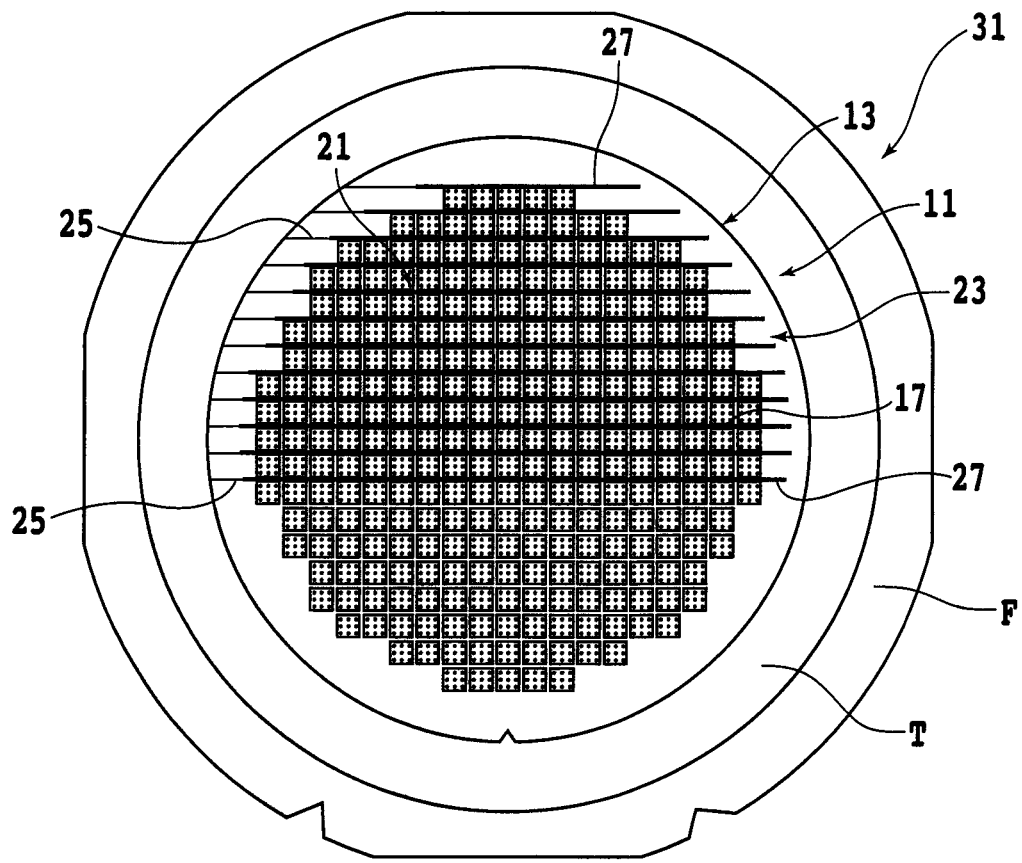
FIG. 4B is a plan view of the bonded wafer after the device area processing step has been carried out along some projected dicing lines.

FIG. 3C depicts the state of the bonded wafer 11 where a lowermost guide groove 25 has just been formed therein along a projected dicing line 17 at the end of the guide groove forming step. FIG. 4B depicts the state of the bonded wafer 11 where the cut groove 27 has just been formed to the second depth along the same projected dicing line 17, following the guide groove forming step.

Figure 5A:
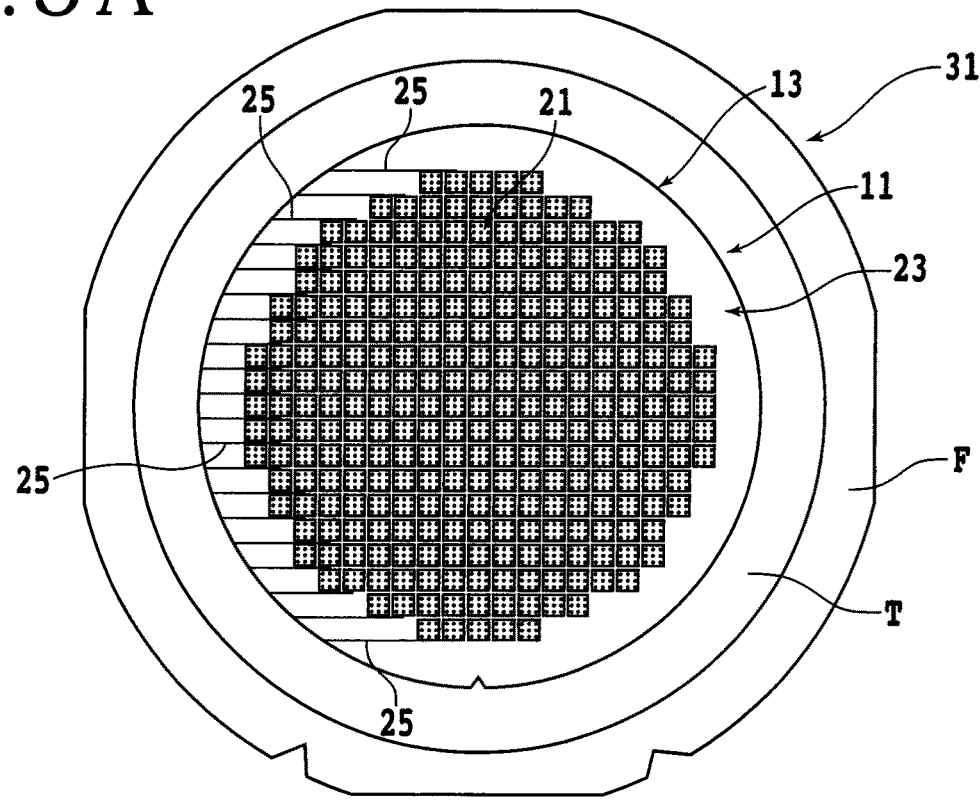
FIG. 5A is a plan view of the bonded wafer with guide grooves formed therein along all projected dicing lines that extend in a first direction.
Figure 5B:
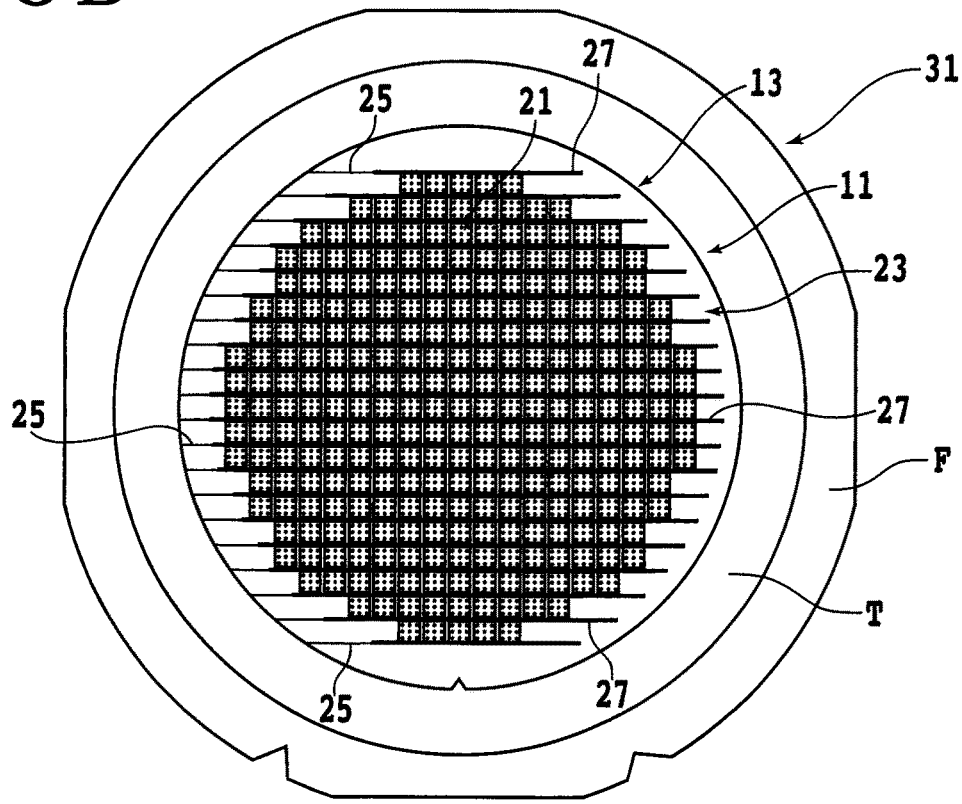
FIG. 5B is a plan view of the bonded wafer with cut grooves formed therein to a desired depth in a chopper cutting mode.

A method of cutting a workpiece according to a second embodiment of the present invention will be described below with reference to FIGS. 5A and 5B. In the method according to the second embodiment, guide grooves 25 are formed to a first depth in the bonded wafer 11 along all the projected dicing lines 17 that extend in a first direction, as shown in FIG. 5A (guide groove forming step).

Then, the cutting blade 50 has its cutting edge cut into the bonded wafer 11 to a second depth larger than the first depth in a chopper cutting mode along one of the projected dicing lines 17 that extend in the first direction in which the guide grooves 25 having the first depth are formed, and then the chuck table 10 is processing-fed to form a cut groove 27 having the second depth in the bonded wafer 11 (device area processing step). The device area processing step is repeated while the cutting unit 14 is indexing-fed in one of the Y-axis directions in FIG. 1, thereby forming cut grooves 27 in the bonded wafer 11 along all the projected dicing lines 17, as depicted in FIG. 5B.

In the method according to the second embodiment, therefore, the guide grooves 25 are formed in the bonded wafer 11 along all the projected dicing lines 17 that extend in the first direction, then the cutting blade 50 has its cutting edge cut into the guide groove 25 in the bonded wafer 11 to the second depth in the chopper cutting mode, and the chuck table 10 is processing-fed and the cutting unit 14 is indexing-fed repeatedly to form the cut grooves 27 in the bonded wafer 11 successively along all the projected dicing lines 17 that extend in the first direction.

Preferably, in the device area processing step, the lowermost cutting edge of the cutting blade 50 cuts into the bonded wafer 11 as far as the dicing tape T to form the cutting grooves 27 having the second depth, thereby fully severing the bonded wafer 11 along the projected dicing lines 17.

In the method according to the second embodiment, since the cutting blade 50 initially cuts the shallow guide grooves 25 in the traverse cutting mode in the outer peripheral extra area 23 and the device area 21 contiguous to the outer peripheral extra area 23, which will be processed by the cutting blade 50 in the chopper cutting mode, surface chippings are prevented from being produced when the device area processing step is carried out on the bonded wafer 11 in the chopper cutting mode. Consequently, the outer peripheral extra area 23 of the bonded wafer 11 is prevented from producing offcut chips when the bonded wafer 11 is cut by the cutting blade 50.

After the guide groove forming step and the device area processing step have been carried out along all the projected dicing lines 17 that extend in the first direction, the chuck table 10 with the bonded wafer 11 held thereon may be turned 90° about its own axis, and then the guide groove forming step and the device area processing step may be carried out along all the projected dicing lines 17 that extend in a second direction perpendicular to the first direction.

When the guide groove forming step and the device area processing step are carried out on the bonded wafer 11 along all the projected dicing lines 17 that extend in the first and second directions, the device area 21 is divided into individual device chips with the respective devices 19 disposed thereon, leaving the outer peripheral extra area 23 of the bonded wafer 11 as an annular uncut portion.

While the method according to the present invention has been illustrated as being performed on the bonded wafer 11 in the above embodiments, the workpiece that is to be cut by the method according to the present invention is not limited to a bonded wafer, but the present invention is also applicable to a single wafer, a packaged substrate, or the like.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of cutting a plate-shaped workpiece having on a face side thereof a device area that is demarcated by a grid of projected dicing lines into a plurality of subareas where respective devices are formed, and an outer peripheral extra area surrounding the device area, to form cut grooves to a predetermined depth in the device area of the workpiece, comprising:

a holding step of holding the workpiece on a holding surface of a chuck table;

a guide groove forming step of forming a guide groove to a depth smaller than said predetermined depth in the workpiece, said guide groove extending from said outer peripheral edge to an end portion of said device area, by causing a cutting blade to cut into the workpiece held on the holding surface of said chuck table from an outer peripheral edge of the workpiece along one of said projected dicing lines;

after the guide groove forming step, a first retracting step of retracting the cutting blade away from the workpiece by lifting the cutting blade;

after the first retracting step, a device area processing step of forming a groove to said predetermined depth in the workpiece along the projected dicing line, said groove extending from said device area beyond an opposite end of said device area to a portion of said outer peripheral extra area, after lowering the cutting blade toward and into the guide groove in said device area and then positioning a cutting edge thereof at said predetermined depth; and after the device area processing step, a second retracting step of retracting the cutting blade away from the workpiece by lifting the cutting blade while leaving a portion of said outer peripheral extra area uncut, wherein surface chippings are prevented by the guide groove from being produced on the workpiece when the cutting blade is lowered toward and into the guide groove at the device area processing step.

2. The method according to claim 1, further comprising:

before the holding step, a sticking step of sticking a dicing tape to a reverse side of the workpiece, wherein the workpiece is held on the holding surface of said chuck table through the dicing tape; and the cutting edge of said cutting blade is caused to cut into the workpiece as far as said dicing tape to form the groove to said predetermined depth, thereby fully severing the workpiece.

* * * * *